(12) United States Patent
Bonen

(10) Patent No.: US 12,341,481 B2
(45) Date of Patent: Jun. 24, 2025

(54) ADJUSTMENT OF POWER AMPLIFIER BIAS BASED ON MEASURED POWER LEVEL HANDLED BY POWER AMPLIFIER

(71) Applicant: Harmonic, Inc., San Jose, CA (US)

(72) Inventor: Adi Bonen, North York (CA)

(73) Assignee: Harmonic, Inc., San Jose, CA (US)

( * ) Notice: Subject to any disclaimer, the term of this patent is extended or adjusted under 35 U.S.C. 154(b) by 607 days.

(21) Appl. No.: 17/592,939

(22) Filed: Feb. 4, 2022

(65) Prior Publication Data

US 2023/0253935 A1 Aug. 10, 2023

(51) Int. Cl.
*H03F 3/24* (2006.01)

(52) U.S. Cl.
CPC ....... *H03F 3/245* (2013.01); *H03F 2200/451* (2013.01)

(58) Field of Classification Search
CPC .... H03F 3/245; H03F 2200/451; H03F 3/195; H03F 1/0266; H03F 1/0272
USPC ........................................................ 330/296
See application file for complete search history.

(56) References Cited

U.S. PATENT DOCUMENTS

| | | | |
|---|---|---|---|
| 7,420,421 B1 | 9/2008 | Lie et al. | |
| 7,443,244 B2 | 10/2008 | Hagen | |
| 7,593,702 B1 | 9/2009 | Lie et al. | |
| 8,742,843 B2 | 6/2014 | Cowley et al. | |
| 10,505,499 B1 | 12/2019 | Bonen | |
| 2014/0184335 A1 | 7/2014 | Nobbe et al. | |
| 2015/0180421 A1* | 6/2015 | Balteanu | H04B 1/40 455/571 |
| 2020/0329282 A1* | 10/2020 | Mäki | H04B 1/12 |

* cited by examiner

*Primary Examiner* — Andrea Lindgren Baltzell
*Assistant Examiner* — Jose E Pinero
(74) *Attorney, Agent, or Firm* — Brokaw Patent Law PC; Christopher J. Brokaw

(57) ABSTRACT

Dynamic adjustment of the power amplifier bias of a power amplifier. Circuitry, disposed within an apparatus, measures the power level presently being handled by the power amplifier. The circuitry adjusts the power amplifier bias for a power amplifier based on the measurement of the power level presently being handled by the power amplifier and a desired fidelity experienced by RF signals processed by the power amplifier. The adjustment in the power amplifier bias for the power amplifier causes an adjustment in a power consumption of the power amplifier, thereby enabling great saving in the DC power required by a power amplifier, and thus, substantially reduces the power consumption of the apparatus in which it operates, such as a Remote PHY node, a Remote MACPHY node, a HFC RF amplifier, a wireless communication device, cellular transmission equipment, or a satellite transponder, for example.

22 Claims, 5 Drawing Sheets

ADJUSTMENT OF POWER AMPLIFIER BIAS BASED ON MEASURED POWER LEVEL HANDLED BY POWER AMPLIFIER

FIELD OF THE INVENTION

Embodiments of the invention generally relate to the adjustment of a power amplifier bias based on measured levels of power handled by the power amplifier.

BACKGROUND

Hybrid Fiber Coax (HFC) is a term that refers to a broadband network based on a combination of optical fiber and coaxial cable. A HFC architecture is often used by cable TV (CATV) operators. In modern cable TV networks, optical fiber is used to transport data between the headend and an optical node deployed in a neighborhood or area of service, while coaxial cable is used to transport data between the optical node and the local houses and locations in the area of service of that optical node.

Over the years, the CATV hybrid Fiber Coax (HFC) architecture has evolved such that the optical node is deployed increasingly closer to the cable customers' premises. Older HFC systems deployed long chains of amplifiers (potentially arranged in a tree structure) between the optical node and cable customers' homes. Over time, amplifier chains have become shorter by segmenting a single long chain of amplifiers to result in multiple smaller chains connected to multiple optical nodes, such that the same area of service previously supported by a single optical node is now serviced by a plurality of optical nodes.

The size of the service domains of an optical node are often quantified not by the length and reach of the coaxial cables, but rather by the number of amplifiers used in the path of the coaxial cable between the optical node and the cable customers. For example, an N+6 deployment signifies that there are as many as 6 amplifiers cascaded between the optical node (N) and the customer.

In an amplifier chain, each amplifier typically receives as input a low-level RF signal from the end of a coaxial cable segment, amplifies the received RF signal, and outputs the amplified RF signal onto the next coaxial cable segment. Each such amplifier introduces undesirable noise and distortion to the RF signal. For this reason, shorter amplifier chains generally result in a better signal quality delivered to the cable customer. To enable a longer reach between amplifiers, the power level at the output of each amplifier is increased.

Recently, Fiber Deep (FD) deployments have become popular, as they represent the next stage in evolution of cable networks. In a FD deployment, optical fiber is extended from the cable operator's headend or hub deep into the CATV outside plant, close to the customers' premises, into an optical node that produces RF signals for final distribution over the coaxial network. Another term used to describe this architecture is N+0, where N stands for the optical node and zero signifies that there are no (zero) standalone RF amplifiers between the optical node and the customers' premises. Since there are no additional amplifiers that can degrade the RF signal fidelity, such deployments often use optical nodes with very high output integrated power amplifiers. These High Output (HO) optical nodes are designed to drive the RF signal into a distribution coax network directly (i.e., without being amplified by further amplifiers) into cable subscriber homes. A typical high output FD optical node comprises 4 output ports, each of which is driven by a dedicated high output RF power amplifier.

Due to their strict linearity requirements and large active RF bandwidth, power amplifiers in both Remote PHY optical nodes and Remote MACPHY optical nodes normally operate as Class A amplifiers, rendering them very inefficient. A Class A power amplifier is an amplifier in which the amplifier bias is set such that the amplifier is not driven into its cut-off or saturation regions by the signal it amplifies. Thus, a Class A amplifier exhibits the lowest signal distortion levels and has the highest linearity over the other amplifier classes. This is at the expense of lower power conversion efficiency, which is measured as signal output power divided by the total power consumed by the amplifier.

Although advances in amplifiers have been made over the years, with newer GaN (Gallium Nitride) amplifiers having improved efficiency over prior GaAs (Gallium Arsenide) amplifiers, the typical achievable efficiency of the best high output CATV power amplifiers remains lower than 3.5% at the power amplifier output and less than 2% at the optical node output. The most advanced and highest output power amplifiers presently available consume about 18 W of power to enable about 0.3 W RMS RF power at the output of the optical node. In a typical Remote PHY node having 4 node ports, more than half of the power consumed by the Remote PHY node is consumed by the 4 high output RF power amplifiers for those 4 node ports.

FIG. 1 is an illustration of power amplifier 10 which may be used in the prior art. Many power amplifiers in the prior art allow for lowering the amplifier bias current of power amplifier 10 using adjustable bias current control 12 having a fixed predetermined bias that is established at time of manufacture. Also in the prior art, voltage source 14 may use a lower voltage than is typically used with power amplifier 10. In either case, not only will the power consumed by power amplifier 10 be reduced, but the maximum RF signal power of RF out signal 16 that power amplifier 10 can output without generating significant distortions will also be reduced.

For this reason, when power amplifiers are used in optical nodes which require a lower RF signal power than the maximum capability of the power amplifier, it is standard procedure to design and manufacture the optical node to employ a lower current bias in the power amplifier. The level of the current bias for the power amplifier is adjusted down by design to a level which is just sufficient to support the desired RF signal output power without generating distortions. Doing so enables the power consumption of the power amplifier, and the optical node in which it is installed, to be lowered while still allowing for the output signal to be generated with sufficient fidelity. When such bias adjustment is practiced, it is done during the design and/or manufacturing of the optical node. Consequently, the power consumption of the power amplifier, and thus by extension the maximum power of the RF signal output that the power amplifier can support as part of an optical node, is fixed for the life of the optical node.

U.S. Pat. No. 10,505,499 (the '499 patent), entitled "Power Saving by Configurable Adjustment of Power Amplifier," issued on Dec. 10, 2019, invented by Adi Bonen, discusses various approaches for adjusting the power amplifier bias of a power amplifier based on a configuration of the power amplifier. The '499 patent is hereby incorporated by reference for all purposes in its entirety as if fully set forth herein.

The bias of any power amplifiers comprised within an optical node is adjusted in advance (i.e., during manufacturing) for the worst case (i.e., highest) desirable RF signal output power. Thus, anytime that the optical node is operating at lower RF signal output power, the power amplifier efficiency is lower than what is required at that time, and the optical node consumes higher power than required at that time, thus wasting power.

The RF spectrum at the output of a Remote PHY node (as is the case in other nodes) has a large positive tilt, i.e., higher frequency signals possess higher amplitude and power. This large positive tilt is due to the larger attenuation experienced by higher frequency signals in both coaxial cables and other passive devices used in the cable plant (such as splitters and taps). Since higher frequency signals possess higher power, the higher frequency signals are responsible for most of the power consumed by the power amplifier.

For example, a typical RF spectrum power profile in a Remote PHY node has 22 dB of linear positive tilt across the downstream spectrum from 54 MHz to 1218 MHz. Positive tilt means that higher frequencies have higher power; in this example, the signal occupying the 6 MHz bandwidth near 1218 MHz is 22 dB higher that the 6 MHz bandwidth near 54 MHz. Linear tilt means that a constant power slope is applied across the spectrum between 54 MHz and 1218 MHz, which amounts to an increase of about 1 dB in signal power for frequency increase of 53 MHz.

As a result of the large positive tilt at the output of an optical node, a large amount of the power is concentrated in higher frequencies. In the RF spectrum power profile of the above example, the spectrum portion above 1 GHz, which is less than 20% of the total downstream portion supported by an optical node in this example, contains more than 60% of the total RF power.

Recently, cable deployment has seen quite a few growth steps with respect to the amount of spectrum used. As a result, cable operators normally plan, design, and deploy equipment (including optical nodes) to support higher downstream spectrum capability than can be utilized when the equipment is first deployed. All portions of a cable plant must be capable of higher spectrum utilization before such higher spectrum capability can actually be used. Even when all the cable plant elements of a certain portion of the plan are capable of higher spectrum utilization, it is often not possible to utilize that higher portion of the spectrum due to the desire to have all portions of the cable plant to use the same level of service and channel lineup. As a result, higher frequency utilization may be held back for some time until all portions of the cable plant are upgraded and all the subscribers served by the cable plant can enjoy such advancement.

Consequently, cable equipment (including optical nodes) is typically deployed with maximum limitations enabling higher frequency capability than what it actually carries for several years. Specifically for power amplifiers in an optical node, these power amplifiers are biased to support the fully possible utilization, and thus typically for several years they consume more power than strictly required by the current RF signals they process.

For example, consider FIG. 2, which is a graph depicting a RF spectrum power profile for a Remote PHY node in accordance with the existing state of the art. The RF spectrum power profile shown in FIG. 2 has an active spectrum up to 750 MHz vs. a node capability of RF spectrum up to 1218 MHz with a moderate positive tilt of 16 dB. An optical node deployed to support RF signals up to 1218 MHz may be initially used with RF signal up to typical values such as 750 MHz, 870 MHz or 1002 MHz. During which time the amplifiers consume the power required for RF spectrum up to 1218 MHz. If the amplifier was biased to support RF signals only up to 1002 MHz, about 60% of the power consumed by the amplifier could have been saved, but that would have prevented the node from being used to handle RF signals above 1002 MHz. It is undesirable to have any man-made component consume more power than necessary due at least in part to the impact to the environment and the unnecessary expenditure of financial resources.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for adjustment of a power amplifier bias for a power amplifier based on measured levels of power handled by the power amplifier are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Physical Description Of Embodiments

Approaches are discussed herein for an adjustment of a power amplifier bias for a power amplifier. The adjustment of the power amplifier bias is performed dynamically based on measured power levels being handled by the power amplifier. Advantageously, embodiments allow for the power amplifier bias to be optimized without advanced knowledge of the characteristics of the RF signals handled by the power amplifier to a high degree of precision, which can naturally vary in the years between manufacturing and deployment, let alone between the years spanning the operational lifespan of a power amplifier.

Embodiments of the invention may be used in conjunction with one or more power amplifiers in a variety of different types of apparatuses, including optical nodes (such as a Remote PHY node or a Remote MACPHY node), HFC RF amplifiers, wireless communication devices, cellular communication devices, and satellite devices (such as but not limited to satellite transponders). To provide a concrete example of but a few implementing mechanisms, a description of a particular type of optical node, a Remote PHY node, comprising a power amplifier and two examples of a HFC RF amplifier comprising a power amplifier will be presented.

Figure 1:
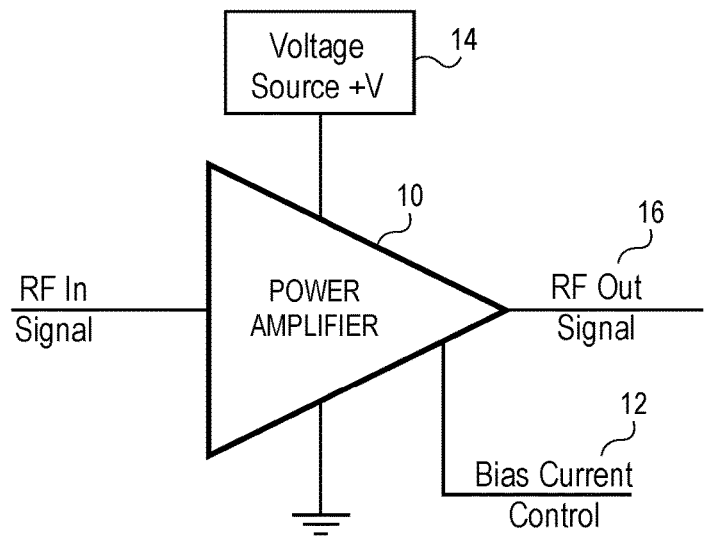
FIG. 1 is an illustration of a power amplifier having an adjustable bias current control according to the prior art.
Figure 2:
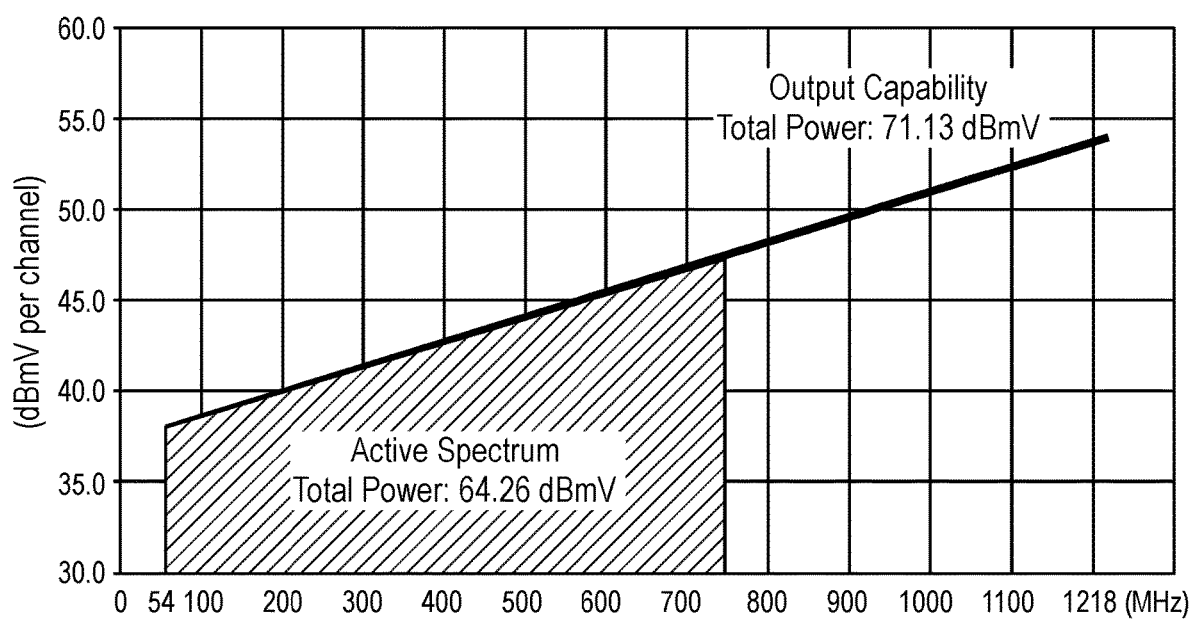
FIG. 2 is a graph depicting a RF spectrum power profile for a Remote PHY node in accordance with the existing state of the art.
Figure 3A:
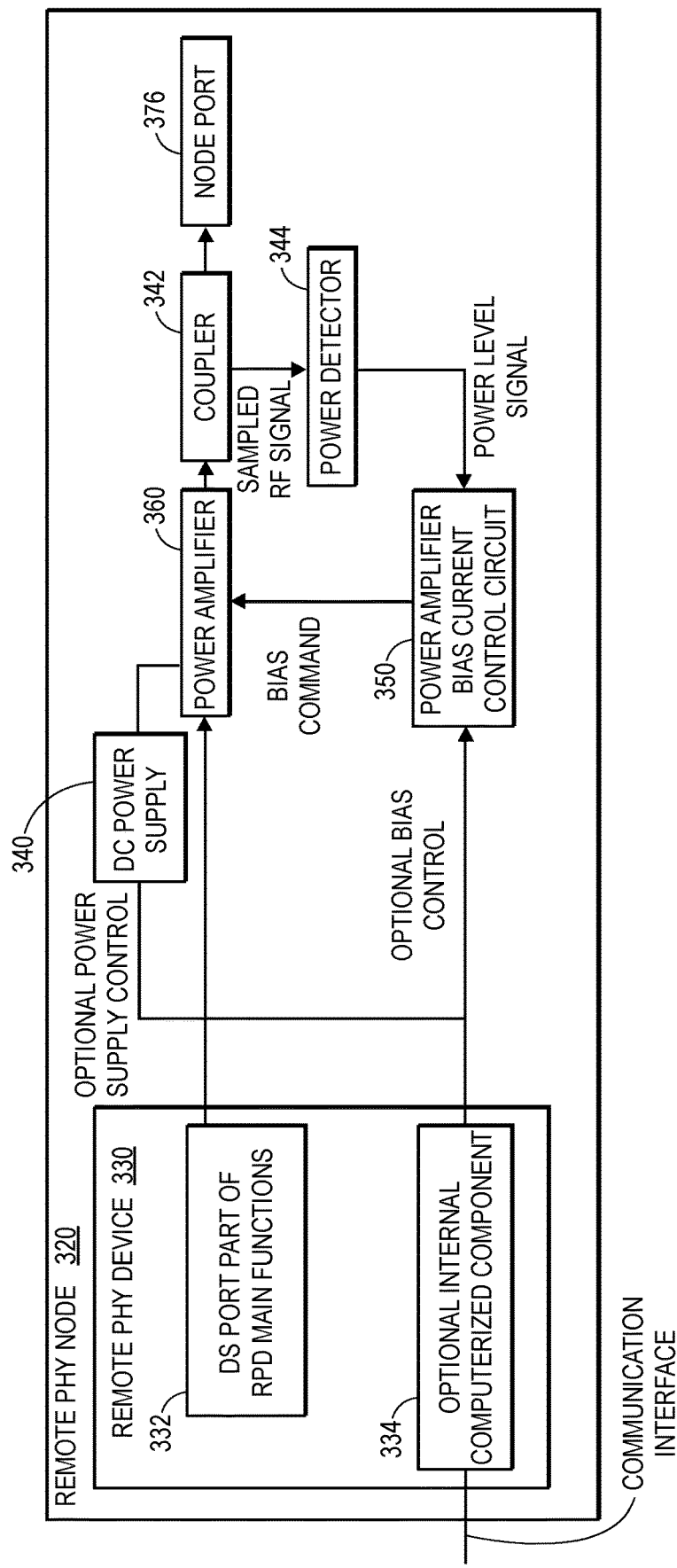
FIG. 3A is a block diagram of a Remote PHY node (RPN) in which an embodiment of the invention may be implemented.

FIG. 3A is a block diagram of a Remote PHY node (RPN) 320 in which an embodiment of the invention may be implemented. The function of RPN 320 is to convert downstream DOCSIS data, MPEG video, and out-of-band (OOB) signals from digital to analog one way and transmit them over a plurality of coaxial cables leading to cable subscribers' homes, and receive upstream data, video, and OOB signals from coaxial cables in analog format and convert them to digital the other way. The digital signals are exchanged between the CCAP Core and Remote PHY Device (RPD) 330, comprised within RPN 320, typically over digital fiber.

Remote PHY nodes, such as RPN 320, are designed to be deployed outdoors near the physical area to be serviced by RPN 320. A non-limiting, illustrative example of RPN 320 includes Harmonic, Inc.'s CableOS™ Ripple-1 Remote PHY node. RPN 320 is composed of an outer housing that surrounds at least one power supply 340 and at least one Remote PHY Device (RPD) 330. While only one RPD 330 is depicted in RPN 320 in FIG. 3, other embodiments may employ two or more RPD 330 disposed within a RPN 320. The outer housing of RPN 320 is designed to provide a hermetically sealed environment to the interior of RPN 320. The hermetically sealed environment provided by the outer housing of RPN 320 helps protect internal components such as power supply 340 and RPD 330 from outdoor environmental factors, such as humidity, water, debris, and changes in pressure.

RPD 330 is a device which performs many of the functions involved in converting downstream DOCSIS data, MPEG video, and out-of-band (OOB) signals from digital to analog. These functions are depicted in FIG. 3A as being performed by DS Port Part of RPD main functions 332. RPD 330 may also comprise internal computerized component 334, which is responsible for certain responsibilities discussed herein, such as configurable adjustment of a power amplifier bias for a power amplifier. A non-limiting, illustrative example of Remote RHY device 330 is Harmonic, Inc.'s CableOS™ Pebble-1 Remote PHY device.

Embodiments may, but need not, comprise an optional component referred to as Internal Computerized Component 334. In addition to data transmitted through RPD 330 to and from cable subscribers, and in addition to communications required to fulfill the operation of the DS Port Part of RPD main functions 332, Internal Computerized Component 334 of RPD 330 may send and receive data communications over the optical network (or over a wireless network in contexts where such a network is available). This allows an operator or technician to send and receive data to RPN 320 deployed in the field, such as for purposes of configuring the operation of RPN 320 and/or providing additional or revised data or executable instructions to Internal Computerized Component 334. Internal Computerized Component 334 is optional and need not be present in all embodiments.

Coupler 342, situated at the output of power amplifier 360, passes most of the RF signal power to node port 376, and couples a small portion of the RF signal to power detector 344. The portion of RF coupled by coupled 342 to power detector 344 is proportional to the level of the RF signal at the output of power amplifier 360. Power detector 344 is a component responsible for measuring the power handled by power amplifier 360. The power measured by power detector 344 is used by power amplifier bias current control circuit 350 in ascertaining the desired power amplifier bias for power amplifier 360. In some embodiments, power amplifier bias current control circuit 350 may be implemented in hardware circuitry; in other embodiments, power amplifier bias current control circuit 350 may be performed, at least in part, in software.

Figure 3B:
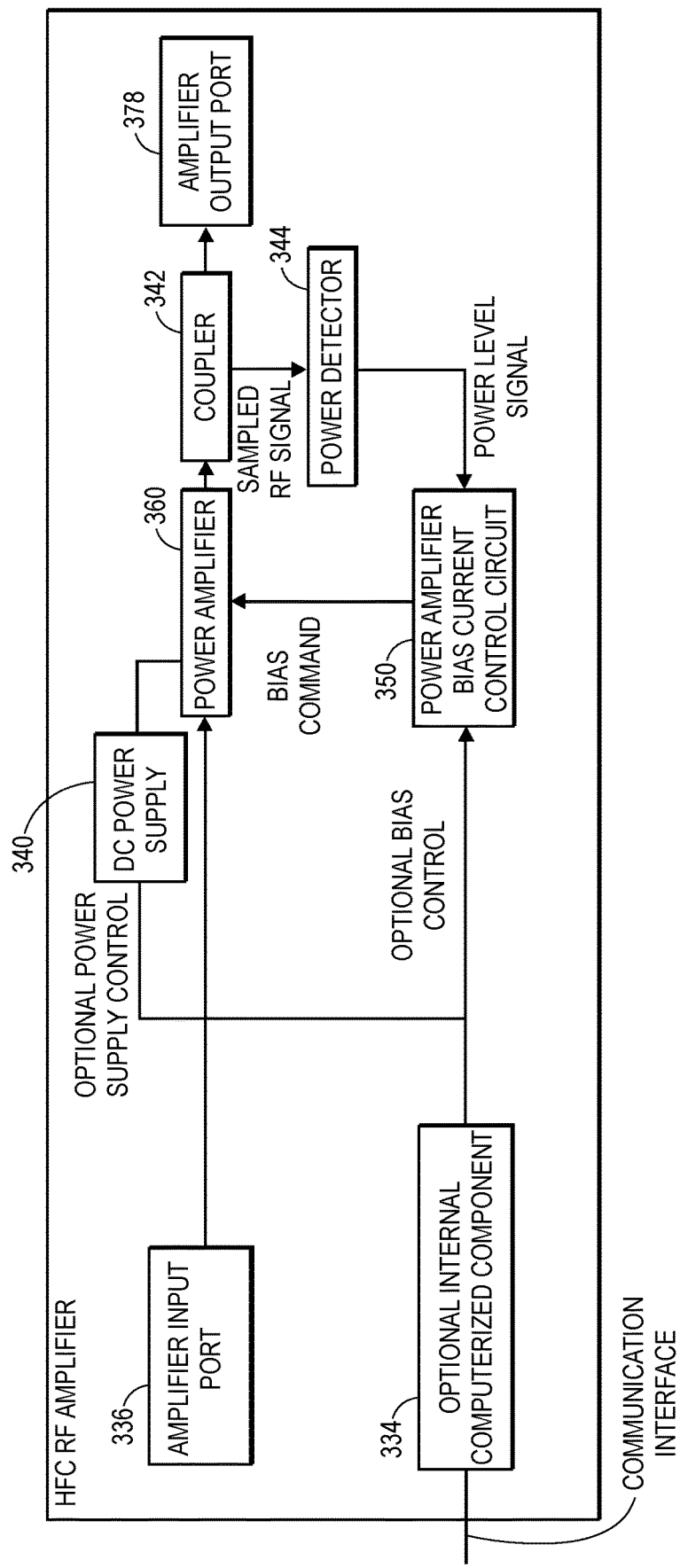
FIG. 3B is a block diagram of an HFC RF amplifier having its power level measured in a first way in accordance with an embodiment of the invention.
Figure 3C:
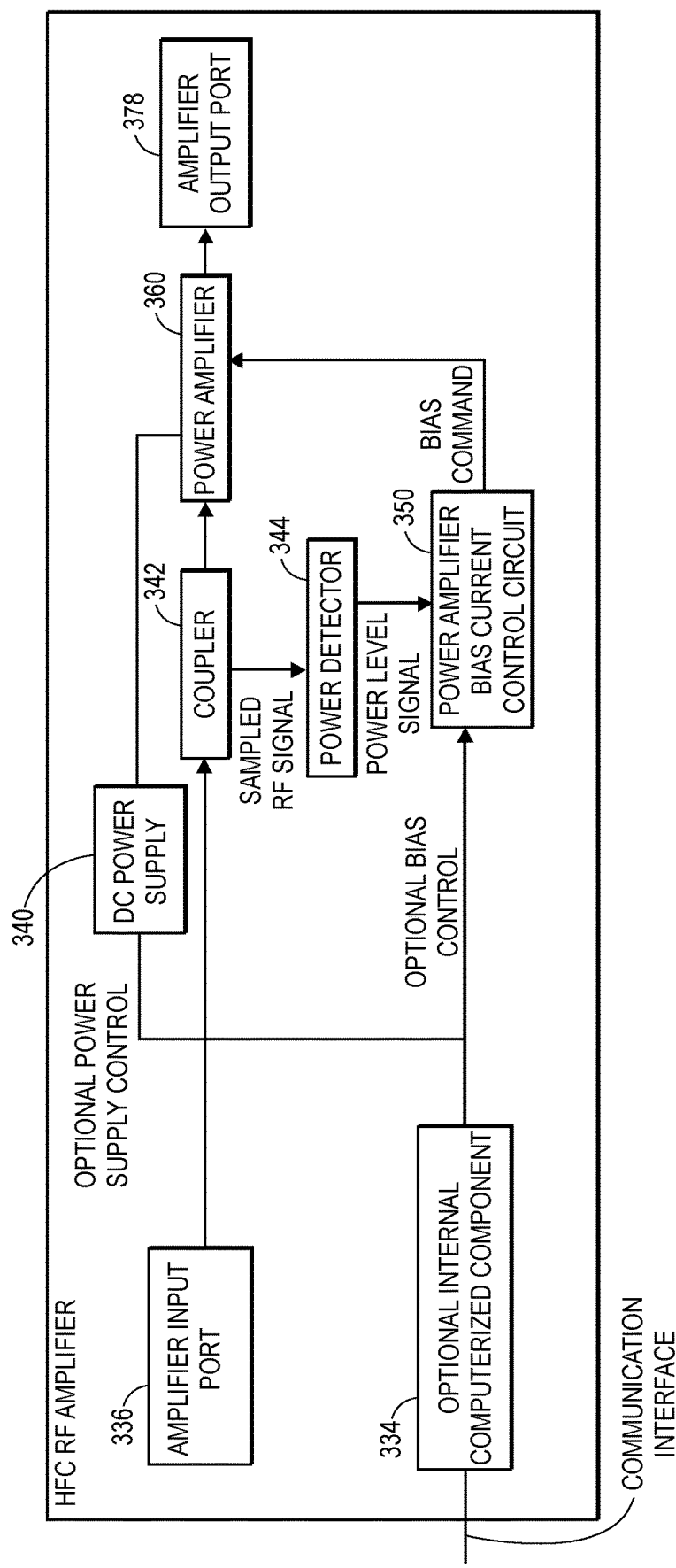
FIG. 3C is a block diagram of an HFC RF amplifier having its power level measured in a second way in accordance with an embodiment of the invention.

Coupler 342 may be deployed in various locations relative to power amplifier 360. To illustrative, consider FIGS. 3B and 3C, which are two block diagrams of a power amplifier having its power level measured by power detector 344 through coupler 342 disposed in different locations in accordance with an embodiment of the invention. Coupler 342 of 3B is disposed after power amplifier 360 in the signal path as the signal propagates to amplifier output port 378, whereas coupler 342 of FIG. 3C is disposed before power amplifier 360 in the signal path as the signal propagates to amplifier output port 378. The embodiments depicted by FIGS. 3B and 3C depict examples other than the technical context of an optical node.

Adjusting Power Amplifier Bias Based on Measured Power

Figure 4:
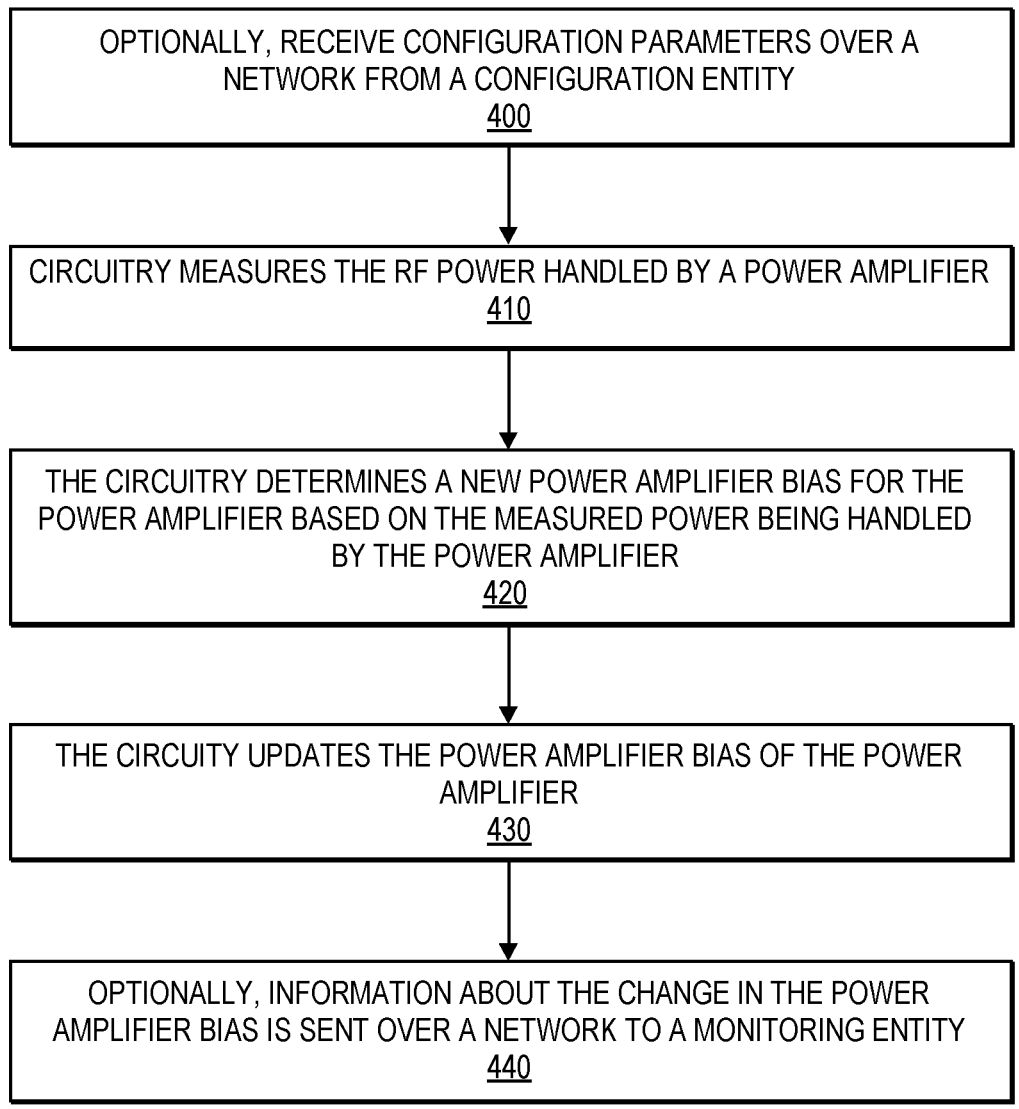
FIG. 4 is a flow chart of the functional steps of the adjustment of a power amplifier bias for a power amplifier based on measured levels of power handled by the power amplifier in accordance with an embodiment of the invention.

FIG. 4 is a flow chart of the functional steps of the adjustment of the power amplifier bias of a power amplifier based on the measured power level that the power amplifier is handling in accordance with an embodiment of the invention. The steps of FIG. 4 will be explained with reference to components depicted in each of FIGS. 3A-3C.

Step 400 is an optional step that may, but need not, be performed by an embodiment. In step 400, configuration parameters may optionally be received at a physical device over a network from a configuration device. Alternately and/or additional, certain embodiments may optionally store certain configuration parameters at a physical device without transmitting them over a network, e.g., the configuration parameters may be stored at time of manufacture and/or updated by a technician.

The configuration parameters of step 400 may establish when RF signal power measurements are taken, how multiple consecutive measurements are pre-processed (e.g., averaging or low pass filtering), and/or how the measured power is used to adjust the power amplifier bias of the power amplifier. Configuration parameters may be stored in non-volatile memory.

In step 410, circuitry, such as power detector 344, measures the RF power being handled by power amplifier 360 by receiving a proportional sample of the RF power through coupler 342. The time frame over which the RF power is measured is step 410 may be set using prior knowledge of how fast the RF signal power may change and how fast should the power amplifier bias of the power amplifier be adjusted to RF signal power changes. In addition, that time frame may be configurable. For example, the measurement may be performed continuously through the day (such as daytime and nighttime). Embodiments may perform step 410 continuously, applying methods such as sliding window averaging or low-pass-filtering to the measurements; periodically, e.g., every several seconds or several minutes; or at certain configured times.

In step 420, circuitry, such as power amplifier bias control circuit 350, determines a new power amplifier bias for power amplifier 360 based on the measured RF power being handled by power amplifier 360 determined in step 410. The new power amplifier bias should be the power amplifier bias that provides the desired fidelity for the RF power of the signal being processed by the power amplifier 360. In some but not all embodiments, power amplifier bias control circuit 350 may operate by considering data and/or configuration provided by internal computerized component 334 received over a network from a configuration entity and/or saved in non-volatile memory.

In step 430, circuitry, such as power amplifier bias control circuit 350, updates the power amplifier bias of power amplifier 360 determined in step 420.

In optional step 440 periodically, upon a configurable schedule or upon request, information about the change in the power amplifier bias may be sent over a network to a monitoring entity. For example, internal computerized component 334 may transmit data over an optical link to a monitoring device in charge of estimating utility power usage about the bias power applied to power amplifier 360 which can be translated to the power consumed by said power amplifier 360. Non-limiting, illustrative examples of such data that may be sent by internal computerized component 334 over an optical link to a CCAP Core about power amplifier 360 include, without limitation, data about (a) a current power savings associated with the reductions in power amplifier bias from a maximum power amplifier bias associated with power amplifier 360 and (b) an accumulated power savings associated with the reductions in power amplifier bias from a maximum power amplifier bias associated with power amplifier 360.

Additional Embodiments

In embodiments of the invention, the reaction time for changing the power amplifier bias may be faster in one direction than another. Specifically, it may be advantageous to raise the power amplifier bias quickly upon detecting a rise in the RF signal power, as this will minimize the time that lower signal fidelity is present due to insufficient power amplifier bias to handle the higher RF signal power level. In contrast, it may be advantageous to keep the power amplifier bias unchanged for a while upon detecting a decrease in the RF signal power to ensure that the decrease in the RF signal power is not temporary. Only after the new lower RF signal power is confirmed to be stable will it be appropriate to reduce the power amplifier bias.

By adjusting the power amplifier bias based on observation and measurement, it is anticipated that the total cost of ownership of certain advance communication devices such as optical nodes and HFC RF amplifiers embodying the invention may pay for themselves over the lifetime of the advance communication device due to the savings in electricity.

In an embodiment of the invention, power amplifier bias current control circuit 350 is used to control the bias current of power amplifiers 360 in RPN 320. Such control can be fine-tuned with high resolution using a Digital to Analog Converter (DAC).

Means can be provided to a technician located remotely from power amplifier 360 to control and change this RF signal output power capability of power amplifier 360 as needed. Thus, the technician can manually change the bias of power amplifier 360 when higher RF signal power level is expected at node port 370 due to changing the application supported by power amplifier 360 and/or when the spectrum loading carried by power amplifier 360 is configured to support higher frequencies.

In another embodiment, a computerized process may consult a configuration and be employed to dynamically and automatically calculate the minimum bias current and/or the minimum DC supply voltage applied to power amplifier 360. This computerized process may use specific known power amplifier parameters as well as known information about the RF signal power and frequency configured at the output of power amplifier 360. Thus, when a different configuration of node RF signal output power is applied, or when a different RF signal spectrum composition is configured in power amplifier 360, the computerized process will automatically calculate the required bias current and/or DC supply voltage, that when applied to the power amplifier, that power amplifier will produce sufficient signal fidelity at its output, i.e., node port 378.

Note that either the node RF signal output power level or the RF signal spectrum composition of power amplifier 360 may not change often, and power amplifier 360 may operate for several years without any such change applied.

In another embodiment, the configuration and/or computerized process may also consider, and be used to compensate for, known degradation in power amplifier linearity, and thus RF signal fidelity at the output of power amplifier 360, when the power amplifier degradation is associated with changes in the temperature experienced by power amplifier 360. Temperature measurements from a thermal sensor attached to power amplifier 360 may be used to affect the calculation of the required minimum bias current and/or DC supply voltage applied to the power amplifier to ascertain sufficient amplifier linearity and signal fidelity when the temperature changes. Certain techniques that may be used by an embodiment to measure or estimate changes in the temperature experienced by a power amplifier are discussed in U.S. patent application Ser. No. 15/846,926, entitled "Estimated a Lifespan of a Power Supply," invented by Adi Bonen, filed on Dec. 19, 2017, the entire disclosure of which is hereby incorporated by reference for all purposes as if fully set forth herein.

In another embodiment, the configuration and/or computerized process may also consider, and be used to compensate for, other parameters, such as but not limited to, observed power amplifier parameters of power amplifier 360, a determined measure of degradation in power amplifier 360, and on observed environmental affected traits of power amplifier 360.

Embodiments of the invention enable great saving of the DC power required by power amplifier 360, and thus, substantially reduce the power consumption of the apparatus, such as an optical node, when possible.

Embodiments of the invention containing a plurality of output ports driven by a plurality of power amplifiers may adjust the power amplifier bias for each power amplifier in an apparatus independent from the other power amplifier bias for other power amplifier in the apparatus. An independent configuration may be maintained for each power amplifier. Each independent configuration may rely on independent RF signal power measurements in each of the device power amplifiers which bias is being controlled. Alternative embodiments of the invention containing a plurality of output ports driven by a plurality of power amplifiers may adjust the power amplifiers bias of a plurality of power amplifiers based on the RF signal power level measured at just a single power amplifier in the plurality of power amplifiers.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus for dynamic adjustment of a power amplifier bias of a power amplifier, comprising:
    circuitry, disposed within the apparatus, performing a measurement of a power level presently being handled by the power amplifier;
    the circuitry adjusting the power amplifier bias for a power amplifier based on the measurement of the power level presently being handled by the power amplifier and a desired fidelity experienced by RF signals processed by the power amplifier, wherein the threshold for raising the power amplifier bias is capable of being satisfied in less time than the threshold for lowering the power amplifier bias.

2. The apparatus of claim 1, wherein the adjustment in the power amplifier bias for the power amplifier causes an adjustment in a power consumption of the power amplifier.

3. The apparatus of claim 1, wherein the apparatus is a Remote PHY node, a Remote MACPHY node, or a HFC RF amplifier.

4. The apparatus of claim 1, wherein the apparatus is a wireless communication device, cellular transmission equipment, or satellite transponder.

5. The apparatus of claim 1, wherein the circuitry adjusts the power amplifier bias for a power amplifier by referencing a set of configurable parameters.

6. The apparatus of claim 1, wherein the circuitry measures the power level presently being handled by the power amplifier at a location in the signal path prior to or in parallel with the power amplifier.

7. The apparatus of claim 1, wherein the circuitry measures the power level presently being handled by the power amplifier at a location in the signal path after to the power amplifier.

8. The apparatus of claim 1, wherein the circuitry reports, to a remote location over a network, data identifying the adjusted power amplifier bias for the power amplifier.

9. The apparatus of claim 1, wherein the circuitry performs multiple consecutive measurements of the power level using averaging of the power level.

10. The apparatus of claim 1, wherein the circuitry performs a continuous measurement of the power level and applies low-pass filtering to the power level measurement.

11. The apparatus of claim 1, wherein the circuitry adjusts the power amplifier bias of multiple power amplifiers based on the RF signal power measured at a single power amplifier.

12. A method for dynamic adjustment of a power amplifier bias of a power amplifier, comprising:
    circuitry, disposed within the apparatus, performing a measurement of a power level presently being handled by the power amplifier;
    the circuitry adjusting the power amplifier bias for a power amplifier based on the measurement of the power level presently being handled by the power amplifier and a desired fidelity experienced by RF signals processed by the power amplifier, wherein the threshold for raising the power amplifier bias is capable of being satisfied in less time than the threshold for lowering the power amplifier bias.

13. The method of claim 12, wherein the adjustment in the power amplifier bias for the power amplifier causes an adjustment in a power consumption of the power amplifier.

14. The method of claim 12, wherein the apparatus is a Remote PHY node, a Remote MACPHY node, or a HFC RF amplifier.

15. The method of claim 12, wherein the apparatus is a wireless communication device, cellular transmission equipment, or satellite transponder.

16. The method of claim 12, wherein the circuitry adjusts the power amplifier bias for a power amplifier by referencing a set of configurable parameters.

17. The method of claim 12, wherein the circuitry measures the power level presently being handled by the power amplifier at a location in the signal path prior to or in parallel with the power amplifier.

18. The method of claim 12, wherein the circuitry measures the power level presently being handled by the power amplifier at a location in the signal path after to the power amplifier.

19. The method of claim 12, wherein the circuitry reports, to a remote location over a network, data identifying the adjusted power amplifier bias for the power amplifier.

20. The method of claim 12, wherein the circuitry performs multiple consecutive measurements of the power level using averaging of the power level.

21. The method of claim 12, wherein the circuitry performs a continuous measurement of the power level and applies low-pass filtering to the power level measurement.

22. The method of claim 12, wherein the circuitry adjusts the power amplifier bias of multiple power amplifiers based on the RF signal power measured at a single power amplifier.

* * * * *